(12) United States Patent
Ahrens et al.

(10) Patent No.: US 9,820,397 B2
(45) Date of Patent: Nov. 14, 2017

(54) HOUSING FOR RECEIVING ELECTRONIC COMPONENTS

(71) Applicant: SMA Solar Technology AG, Niestetal (DE)

(72) Inventors: Jan-Hinrich Ahrens, Niestetal (DE); Daniel Strautmann, Bodenfelde (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 15/371,587

(22) Filed: Dec. 7, 2016

(65) Prior Publication Data
US 2017/0181298 A1    Jun. 22, 2017

(30) Foreign Application Priority Data
Dec. 7, 2015   (DE) .................... 20 2015 106 657 U

(51) Int. Cl.
| H05K 5/03 | (2006.01) |
| H05K 5/02 | (2006.01) |
| H05K 5/00 | (2006.01) |

(52) U.S. Cl.
CPC ......... H05K 5/0213 (2013.01); H05K 5/0008 (2013.01); H05K 5/0013 (2013.01); H05K 5/0226 (2013.01); H05K 5/03 (2013.01)

(58) Field of Classification Search
CPC .. H05K 5/0213; H05K 5/0008; H05K 5/0013; H05K 5/0226; H05K 5/03
USPC .......................................................... 174/559
See application file for complete search history.

(56) References Cited

U.S. PATENT DOCUMENTS

| 2009/0135607 | A1* | 5/2009 | Holloway | ............... F21V 25/12 |
| | | | | 362/362 |
| 2012/0040213 | A1 | 2/2012 | Byun et al. | |
| 2013/0032219 | A1* | 2/2013 | Heim | .................. H01M 2/1241 |
| | | | | 137/14 |
| 2013/0206759 | A1* | 8/2013 | Wurz | ....................... A62C 3/00 |
| | | | | 220/88.2 |

FOREIGN PATENT DOCUMENTS

| DE | 102004037843 A1 | 2/2006 |
| DE | 102008017593 B3 | 1/2010 |
| JP | H09130064 A | 5/1997 |

* cited by examiner

*Primary Examiner* — Timothy Thompson
*Assistant Examiner* — Michael F McAllister
(74) *Attorney, Agent, or Firm* — Eschweller & Potashnik, LLC

(57) ABSTRACT

A housing for receiving electronic components includes a housing body and a housing cover. The housing body and the housing cover are connected to one another at multiple fastening points. At least one of the fastening points is surrounded by recesses at least in part on the housing body or on the housing cover so that in the event of an internal pressure $p_{in}$ in the housing exceeding a predetermined threshold value $p_{max}$ the housing body or the housing cover deforms in the region of the at least one fastening point and a gap is formed between the housing body and the housing cover.

11 Claims, 8 Drawing Sheets

HOUSING FOR RECEIVING ELECTRONIC COMPONENTS

CROSS REFERENCE TO RELATED APPLICATIONS

This application claims priority to German Patent Application number 20 2015 106 657.0, filed on Dec. 7, 2015, and is hereby incorporated by reference in its entirety.

FIELD

The disclosure relates to a housing for receiving electronic components, wherein the housing comprises a housing body and a housing cover.

BACKGROUND

Electronic components are generally arranged in housings so as on the one hand to protect them from environmental influences such as moisture and on the other hand to ensure that persons are appropriately protected. Such components pose considerable risks to life and limb in particular when using higher electrical voltages and/or currents. For this reason, there are often national regulations that for example prescribe that contact protection must be ensured. This contact protection must be maintained for as long as such components pose potential risks. Such a contact protection is to guarantee that a person cannot be injured by electrical voltages and/or currents, in that said contact protection prevents current-carrying components from coming into contact with persons.

A multiplicity of electronic components or parts can be arranged in such housings to form complex electronic circuits. However, it is sometimes also necessary to provide appropriate protection for simple arrangements that comprise only one or few electronic components. A housing in accordance with the disclosure can hold for example an inverter, electrical storage devices, electrical switching devices, collecting devices and/or monitoring devices.

It is usual for receiving such arrangements to use housings that comprise a housing body and a housing cover that closes said housing. Numerous sealing elements are also used between the housing body and the housing cover in order to protect the housing interior from the penetration of moisture from outside. This produces in this manner in the interior of the housing a space that is protected with respect to the external environment in such a manner that it is at least difficult to balance the pressure between this internal space and the external environment.

This can lead to problems in particular in the event of a sudden increase in pressure in the interior of the housing, such as can occur by way of example during an explosion or ignition of a combustible gas or gas mixture that forms by way of example in the case of defective electronic components in the interior of such a housing. It is not possible owing to the closed housing for the pressure to escape quickly into the environment. This can lead to the housing not being able to withstand the sudden increase in pressure and to said housing splitting open or bursting in an unpredictable manner. In this case, it is possible both for parts from the interior of the housing and also parts of the housing body and/or housing cover to tear off and be catapulted about. Such parts then pose a risk to persons in the vicinity of the housing. It is therefore eminently important to prevent such uncontrolled splitting or bursting of the housing.

Furthermore, it is also not possible in the above described case to prevent parts under voltage from being exposed as a result of the housing bursting and consequently appropriate contact protection is no longer provided.

The case of an internal pressure that exceeds a predetermined threshold value is also described hereinafter as an excess pressure event and the associated pressure is described as excess pressure.

SUMMARY

The present disclosure provides a housing for receiving electronic components, wherein the housing comprises a housing body and a housing cover, wherein in the event that an internal pressure in the housing exceeds a predetermined threshold value an uncontrolled splitting open or bursting of the housing is avoided and the contact protection is also still provided.

The housing in accordance with the disclosure for receiving electronic components comprises a housing body and a housing cover, wherein the housing body and the housing cover are connected to one another at multiple fastening points. At least one of the fastening points is surrounded by recesses at least in part on the housing body or the housing cover so that the housing body or the housing cover deforms in the region of the at least one fastening point if an excess pressure event occurs. A gap is formed between the housing body and the housing cover if an internal pressure in the housing exceeds a predetermined threshold value. In this manner, an uncontrolled bursting of the housing is avoided, a pressure balancing procedure is performed by means of a defined gap between the housing body and the housing cover and the parts of the housing body and/or the housing cover are prevented from being catapulted about.

In one embodiment, the housing cover is prevented from becoming completely detached from the housing body at least at some fastening points by means of fastening elements.

At least some fastening elements can be embodied as screws, rivets, adhesive bonds or weld spots.

In a further embodiment, at least one arrester hook is provided on the housing body or on the housing cover in addition to the fastening elements. Such an arrester hook can be embodied by way of example in the form of a U-shaped rebate on the housing cover and the upper limb of the U-shaped rebate comprises a simple rebate of the housing body at a spacing that is defined for example by legal regulations. Accordingly, a U-shaped rebate could also be provided on the upper region of the housing body, said U-shaped rebate encompasses the housing cover at a spacing that is defined for example by means of legal regulations. Such a spacing can by way of example amount to in the range of a few millimeters up to a few centimeters. If, in this case, the housing cover becomes detached at some fastening points from the housing body, then it can also not become further removed from the housing body than is permitted by the spacing that is predetermined by means of the corresponding rebate. Consequently, it would also be ensured in this case that the housing is not uncontrollably opened and it is also possible to ensure that a required contact protection of the current-carrying components is still provided. Moreover, it is also possible to arrange further recesses by way of example in the housing cover at suitable sites, said recesses making it easier for the housing cover to deform.

A further fastening element is advantageous that is embodied as a hinge on a housing edge that lies opposite at least one fastening point.

In the case of one embodiment of a housing in accordance with the disclosure, in each case at least one of the recesses of the at least one fastening points are arranged in an orthogonal manner with respect to the nearest housing edge of the housing body or of the housing cover. In an advantageous manner, the in each case at least one of the recesses of the at least one fastening point extends as far as the nearest housing edge of the housing body or of the housing cover. Alternatively, in each case at least one of the recesses of the at least one fastening point does not extend continuously as far as the nearest housing edge. It is possible by way of example to leave one or multiple connecting bars, in other words regions, in which the material of the housing body or of the housing cover has not been weakened by the recess or removed. In one embodiment of the housing, wherein the recesses that surround the at least one fastening point at least in part on the housing body or on the housing cover are embodied as a groove or slot, then for example such a groove or such a slot would be interrupted by means of corresponding connecting bars or said groove or slot would terminate, as already described above, in a defined spacing of a few millimeters from the corresponding housing edge. Such connecting bars can also be referred to as so-called predetermined breaking sites. By virtue of the grooves and/or the connecting bars breaking open and also by virtue of further tears forming in the extension of the recesses, the housing is able to absorb energy in the event of an above mentioned sudden increase in pressure and reduce the loading on the fastening elements.

The arrangement of the recesses with regard to the at least one fastening point can be achieved in different ways. Thus, in different inventive embodiments of the housing, the recesses that surround the at least one fastening point at least in part on the housing body or on the housing cover are L-shaped, U-shaped or C-shaped. The dimensions of the recesses must be tailored to suit in each case the housing being used and the threshold value of the pressure in other words the maximum permitted excess pressure. In doing so, the gap width that is to be achieved is also to be taken into consideration in addition to the thickness of the materials being used and their mechanical characteristics.

In a further embodiment of the disclosure, an upper edge of the housing body is embodied at least in part as a rebate and the at least one fastening point that is surrounded by recesses at least in part on the housing body or on the housing cover is arranged on this rebate.

BRIEF DESCRIPTION OF THE DRAWINGS

The disclosure is explained hereinafter with the aid of the figures, in which.

DETAILED DESCRIPTION

Figure 1:
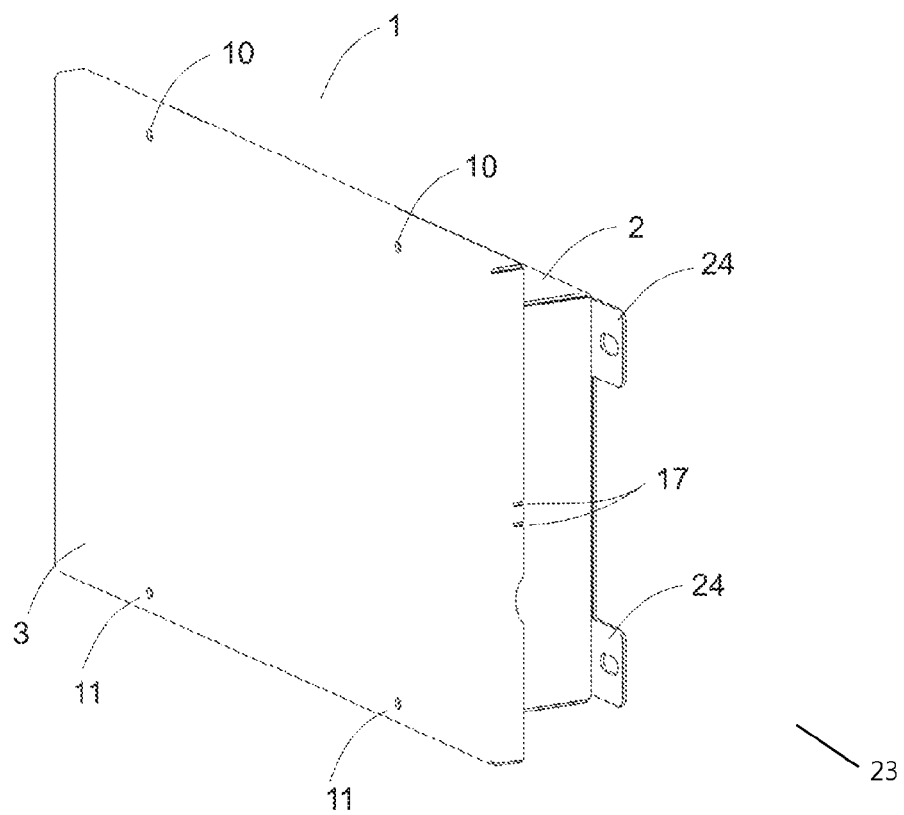
FIG. 1 illustrates a perspective view from the front of a housing in accordance with the disclosure.

FIG. 1 illustrates a perspective view of a housing 1 in accordance with the disclosure for receiving electronic components. The housing cover 3 that closes the housing body 2 comprises rebates 23 that in part encompass the upper part of the housing body 2. The region is provided on the two sides of the housing cover 3 that do not comprise any fastening points 10, 11 with in each case two optional recesses 17 that facilitate a deformation of the housing cover 3 in this region. Furthermore, the housing 1 comprises four fastening points 10, 11. The optional retaining elements 24 are used to fasten the housing 1 by way of example to a wall.

Figure 2:
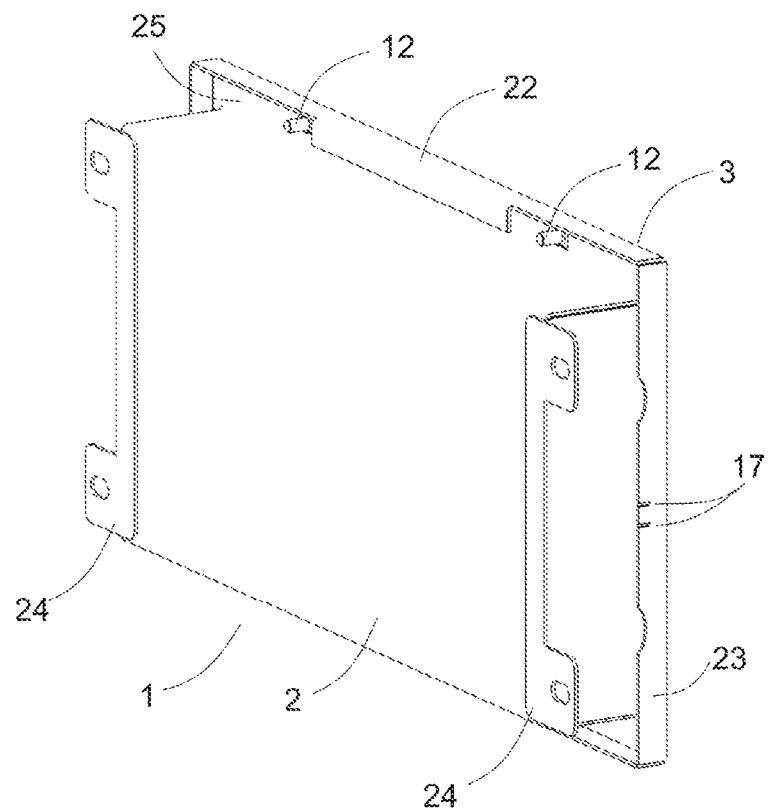
FIG. 2 illustrates a perspective view from the rear of a housing in accordance with the disclosure.

FIG. 2 illustrates a perspective view from the rear of the housing 1 shown in FIG. 1. In addition to the features already mentioned in conjunction with FIG. 1, this figure also illustrates an arrester hook 22 that is arranged on the housing cover 3. The arrester hook 22 is used in this case as an additional optional securing element and prevents the housing cover 3 from becoming completely detached from the housing body 2 in the event that the fastening elements 12 are no longer able to assume this task. The arrester hook 22 is embodied in this case as a U-shaped rebate on the housing cover 3. The upper limb of this U-shaped rebate comprises a simple rebate 25 of the housing body 2. A defined spacing of by way of example 2 mm to 3 cm is provided between the arrester hook 22 and the rebate 25 of the housing body 2.

In the illustrated case, the fastening elements 12 are embodied as screws, wherein so-called insert nuts are evident in FIG. 2.

Figure 3:
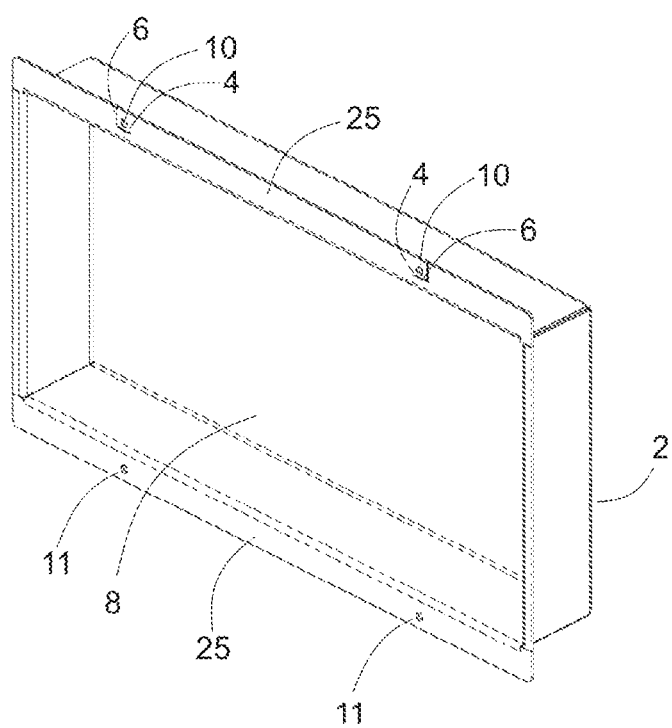
FIG. 3 illustrates a perspective view of a housing body in accordance with the disclosure.

A perspective view of a housing body 2 in accordance with the disclosure is illustrated in FIG. 3. The view into the housing interior 8 is revealed by virtue of not showing the housing cover 3. FIG. 3 also illustrates again the fastening points 10, 11 that are arranged in each case on rebates 25 of the housing body 2. L-shaped recesses 4 in the form of slots 6 are provided in the region of the two upper fastening points 10.

Figure 4:
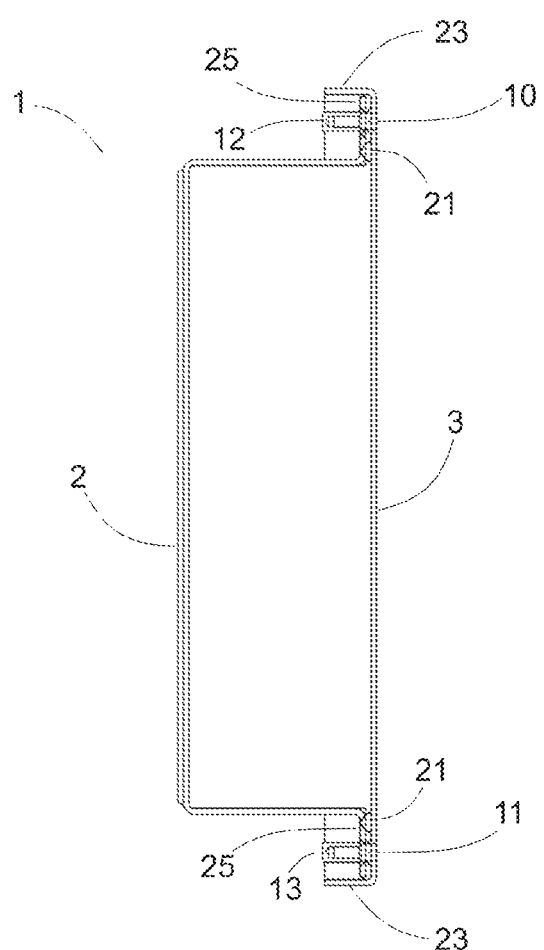
FIG. 4 illustrates a sectional view through a housing in accordance with the disclosure.

FIG. 4 illustrates a sectional view through a housing 1 in accordance with the disclosure. The sectional view is along an axis between the fastening points 10 and 11 shown in FIG. 1 and intersects the fastening elements 12 and 13 that are located at that site.

The housing cover 3 that closes the housing body 2 also comprises in this figure appropriate rebates 25 that encompass in part the upper part of the housing body 2. Furthermore, sealing elements 21 are provided that can be embodied by way of example as annular seals and are pressed through the housing cover 3 onto the rebate 25 of the housing body 2. In this manner, the housing interior can be sealed with respect to the environment. The relevant contact pressure is provided by the fastening elements 12, 13 that are embodied in this case as a screw connection.

FIGS. 5a-5f illustrate different variants in accordance with the disclosure for the arrangement of the recesses 4. It is to be noted that the illustrated variants show only a non-exclusive selection of possible arrangements of the recesses 4. In particular, the variants can also be combined with one another. It is not absolutely necessary that in each case two fastening points 10 are surrounded by such recesses 4. Depending upon the application, it can be advantageous to surround only one fastening point 10, only one part of the fastening points 10, 11 or all fastening points 10, 11 with recesses 4. These recesses can also be arranged on rebates 25 of the housing body 2 or on rebates 23 of the housing cover 3. Furthermore, housing constructions are also feasible in which for example the housing cover 3 and/or the housing body 2 do not have a rebate 23, 25.

Figure 5:
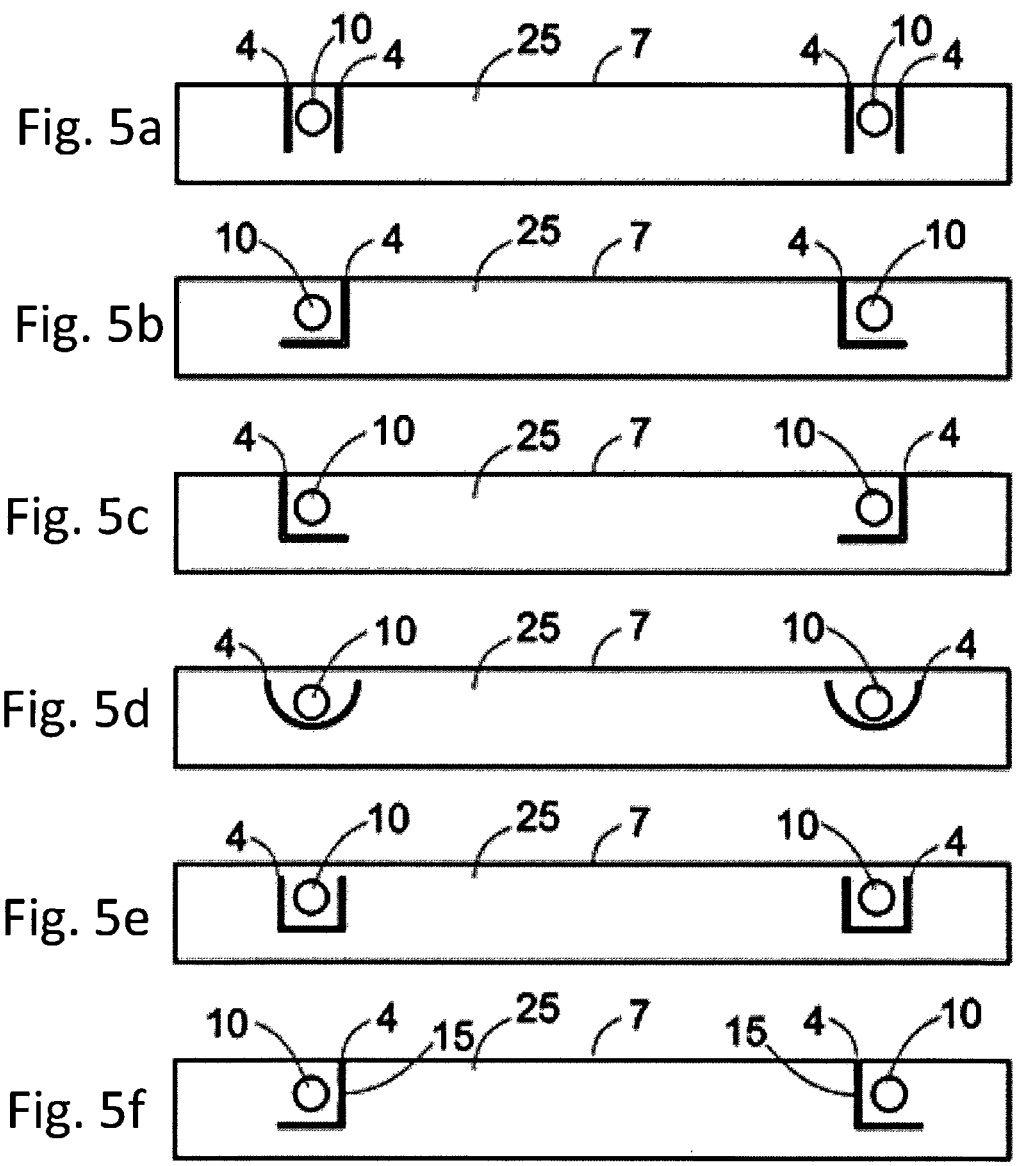
FIG. 5a-5f illustrate various variants of recesses in accordance with the disclosure.

In the examples illustrated in FIGS. 5a-5f, the fastening points 10, 11 are located as illustrated in FIG. 4 on the rebates 25 of the housing body 2. For the sake of clarity, only one section of a rebate 25 is illustrated in each case in the FIGS. 5a-5e. The reference numeral 4 is used in this case to describe the recesses that in the event of an internal pressure in the housing 1 exceeding a predetermined threshold value render it possible for the housing body 2 to deform in the region of the at least one fastening point 10. FIG. 5a illustrates the recesses 4 arranged in each case sideward of the fastening points 10. FIGS. 5b-5e illustrate L-shaped, C-shaped and U-shaped recesses 4. It is to be noted that the recesses 4 in the FIGS. 5a-5c extend as far as the housing edge 7 and 'intersect' said edge. Likewise, it is possible, if for example greater stability of the rebate 25 is required, for material to also remain in the form of connecting bars between the end of the recess 4 and the housing edge 7, wherein said connecting bars function as a type of predetermined breaking point 15 and only break in the event of an excess pressure in the interior of the housing 1. Thus, FIG. 5f illustrates an L-shaped recess 4 that comprise a predetermined breaking point 15 in one limb of the L-shaped recess 4. The number of predetermined breaking points 15 and also their position can vary depending upon the requirement.

Figure 6:
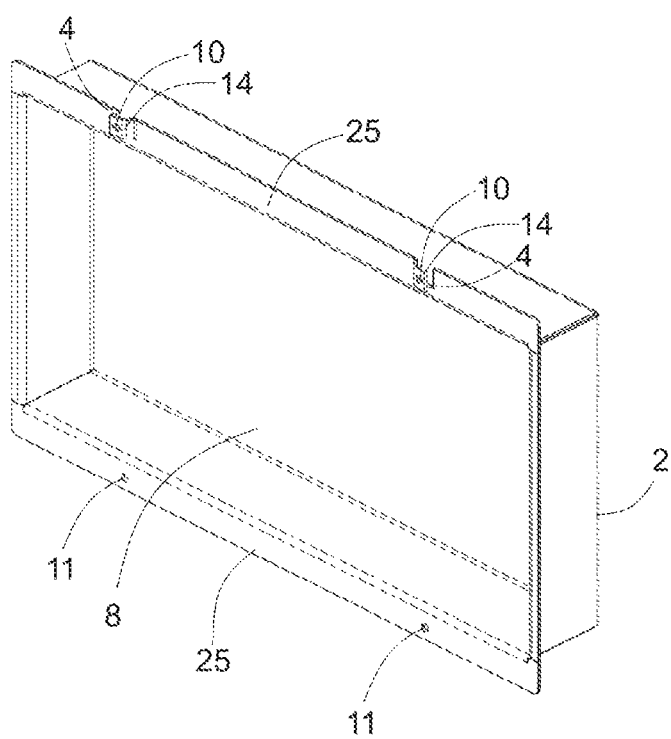
FIG. 6 illustrates a perspective view of a housing body in accordance with the disclosure after an explosion.

FIG. 6 illustrates a perspective view of a housing body 2, which corresponds to the housing body shown in FIG. 3, after an explosion. It is evident that the region of the rebate 25 of the housing body 2 has deformed around the fastening points 10 that are surrounded by recesses 4, in this case in the form of L-shaped slots 6. A flap 14 has formed that has bent out of the original plane of the rebate 25 of the housing body 2. A gap 20, not illustrated in the figure, is formed in this manner between the housing body 2 and the housing cover 3 and it is possible by means of said gap to balance the pressure between the housing interior and the environment. In doing so, the connection between the housing body 2 and the housing cover 3 remains intact on the fastening points 10, 11 so that the housing cover 3 remains on the housing body 2 and as a result of the small gap 20 a contact protection is also still ensured.

Figure 7:
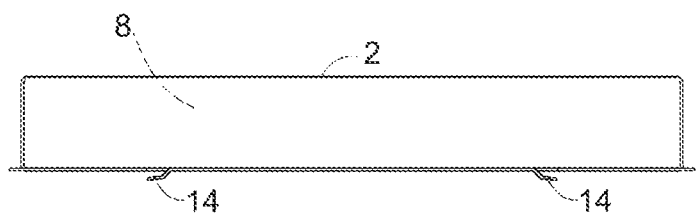
FIG. 7 illustrates a sectional view through a housing in accordance with the disclosure after an explosion and FIG. 8a-8b illustrate a sectional view through a housing in accordance with the disclosure and a detailed view after an explosion.

FIG. 7 illustrates a sectional view along the fastening points 10 of a housing body 2 that corresponds to the housing body shown in FIG. 6. It is again evident in this case that the flaps 14 are bent out of the plane of the rebate 25 of the housing body 2.

Figures 8A, 8B:
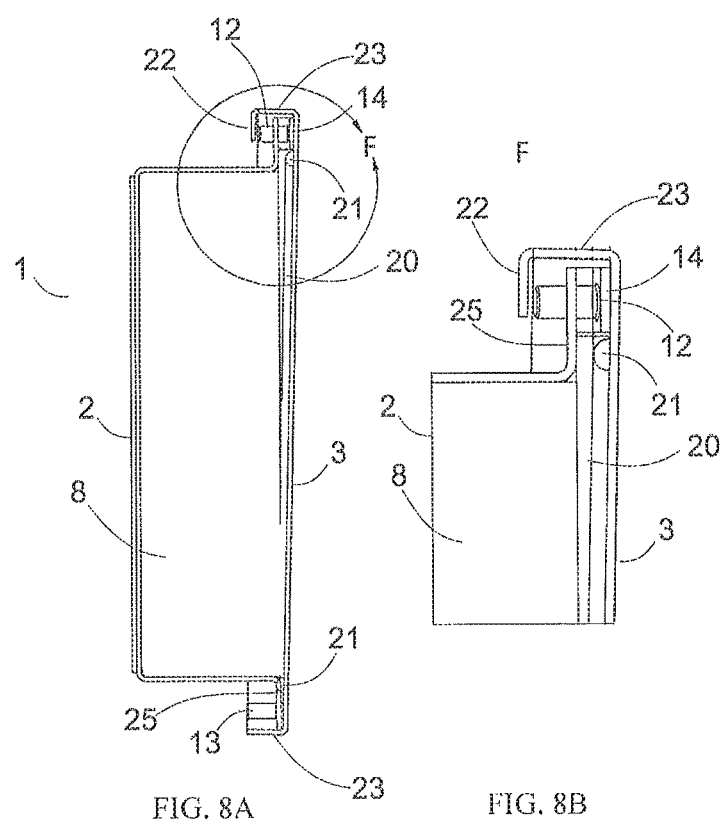

FIG. 8a illustrates a sectional view that corresponds to the sectional view in FIG. 4 through a housing 1 in accordance with the disclosure after an explosion. A gap 20 forms between the housing body 2 and the housing cover 3, by means of which the excess pressure can escape from the housing interior. As illustrated in FIGS. 6 and 7, a flap 14 has formed, however only the part of said flap that has direct contact with the housing cover 3 is evident in FIGS. 8a and 8b. The figure also illustrates the fastening elements 12 and 13 that continue to prevent the housing cover 3 becoming detached from the housing body 2. Furthermore, the arrester hook 22 is located on the rebate 23.

It is clearly evident that the gap 20 is of such a width in the region of the sealing element 21 that this sealing element 21 has completely lost its sealing effect. FIG. 8b illustrates an enlarged sectional view of the region around the fastening element 12, said region being marked by the reference letter F. The sectional view extends through the flap 14 so that only one edge of the flap 14 is visible in this figure.

The invention claimed is:

1. A housing for receiving electronic components, comprising:
   a housing body; and
   a housing cover,
   wherein the housing body and the housing cover are connected to one another at multiple fastening points, and
   wherein at least one of the fastening points is surrounded by recesses at least in part on the housing body or on the housing cover so that in the event of an internal pressure $p_{in}$ in the housing exceeding a predetermined threshold value $p_{max}$ the housing body or the housing cover deforms in the region of the at least one fastening point and a gap is formed between the housing body and the housing cover.

2. The housing according to claim 1, wherein in the event of the threshold value $p_{max}$ is exceeded by the internal pressure $p_{in}$, the housing cover is prevented from becoming completely detached from the housing body at least at some fastening points by means of fastening elements.

3. The housing according to claim 2, wherein
   the fastening elements comprise screws, rivets, adhesive bonds or weld spots.

4. The housing according to claim 2, wherein
   in addition to the fastening elements at least one arrester hook is provided on the housing body or on the housing cover.

5. The housing according to claim 2, wherein
   at least one of the fastening elements is arranged on one housing edge that is located opposite to the at least one fastening point and that this fastening element is a hinge.

6. The housing according to claim 1, wherein in each case at least one of the recesses of the at least one fastening point is arranged in an orthogonal manner with respect to the nearest housing edge of the housing body or of the housing cover.

7. The housing according to claim 1, wherein the recesses that surround the at least one fastening point at least in part on the housing body or on the housing cover comprise a groove or a slot.

8. The housing according to claim 1, wherein the in each case at least one of the recesses of the at least one fastening point extends as far as the nearest housing edge of the housing body or of the housing cover.

9. The housing according to claim 1, wherein in each case at least one of the recesses of the at least one fastening point does not extend continuously as far as the nearest housing edge.

10. The housing according to claim 1, wherein the recesses that surround the at least one fastening point at least in part on the housing body or on the housing cover are L-shaped, U-shaped or C-shaped.

11. The housing according to claim 1, wherein an upper border of the housing body comprises at least in part a rebate and the at least one fastening point, which is surrounded by recesses, at least in part on the housing body or on the housing cover, is arranged on this rebate.

\* \* \* \* \*